(12) United States Patent
Kawasaki et al.

(10) Patent No.: US 7,521,707 B2
(45) Date of Patent: Apr. 21, 2009

(54) SEMICONDUCTOR DEVICE HAVING GAN-BASED SEMICONDUCTOR LAYER

(75) Inventors: Takeshi Kawasaki, Yamanashi (JP); Ken Nakata, Yamanashi (JP); Hiroshi Yano, Yamanashi (JP)

(73) Assignee: Eudyna Devices Inc., Yamanashi (JP)

( * ) Notice: Subject to any disclaimer, the term of this patent is extended or adjusted under 35 U.S.C. 154(b) by 299 days.

(21) Appl. No.: 11/385,749

(22) Filed: Mar. 22, 2006

(65) Prior Publication Data

US 2006/0214188 A1    Sep. 28, 2006

(30) Foreign Application Priority Data

Mar. 22, 2005  (JP) ............................. 2005-082308

(51) Int. Cl.
*H01L 29/06* (2006.01)
(52) U.S. Cl. .............................. 257/20; 257/24; 257/27
(58) Field of Classification Search .................. 257/20, 257/24, 27
See application file for complete search history.

(56) References Cited

U.S. PATENT DOCUMENTS 6,489,628 B1 *  12/2002  Morizuka ..................... 257/12
2005/0077538 A1 *  4/2005  Heikman ..................... 257/183

FOREIGN PATENT DOCUMENTS

JP      2001-077353 A      3/2001
JP      2003-229439 A      8/2003

* cited by examiner

*Primary Examiner*—Phat X Cao
(74) *Attorney, Agent, or Firm*—Westerman, Hattori, Daniels & Adrian, LLP.

(57) ABSTRACT

A semiconductor device includes, an AlGaN electron supply layer having a [000-1] crystalline orientation in a thickness direction to a substrate plane, a GaN electron traveling layer formed on the AlGaN electron supply layer, a gate electrode formed above the GaN electron traveling layer, and a source electrode and a drain electrode between which the gate electrode is located, the source and drain electrode being formed on the GaN electron traveling layer.

4 Claims, 5 Drawing Sheets

MAGNITUDE OF LATTICE CONSTANT

SEMICONDUCTOR DEVICE HAVING GAN-BASED SEMICONDUCTOR LAYER

BACKGROUND OF THE INVENTION

1. Field of the Invention

This invention generally relates to semiconductor devices having a GaN-based semiconductor layers, and more particularly, a GaN-based semiconductor device, a fabrication method of the same, a substrate for fabricating the same, a fabrication method of the substrate, and a growth substrate of the same.

2. Description of the Related Art

The semiconductor device that employs a GaN-based semiconductor, particularly, gallium nitride (GaN) is used as a power device that operates at high frequencies and high power. High Electron Mobility Transistor (HEMT) is known as a semiconductor device that is suitable for amplification especially at high frequency ranges such as microwave, sub-millimeter wave, millimeter wave, and the like. The GaN-based semiconductor is made of, for example, GaN or a mixed crystal of GaN and AlN or GaN and InN.

With respect to HEMT that employs GaN, the technical development is in progress to realize the operation at a higher frequency and higher output. There are demands for increasing the electron density of 2-Dimensional Electron Gas (2DEG) and reducing the contact resistance between the source and drain electrodes and 2DEG (contact resistance of ohmic electrode), in order to realize the operation at a higher frequency and higher output. Also, an enhanced-mode HEMT (E mode HEMT) having a positive threshold voltage is being progressively developed to provide an amplifier that is operable by a single power supply.

HEMT has a normal HEMT structure and an inverted HEMT structure. In the normal HEMT structure, an electron supply layer is deposited on an electron traveling layer, and a gate electrode, a source electrode and a drain electrode are provided on the electron supply layer. In the inverted HEMT structure, the electron traveling layer is deposited on the electron supply layer, and the gate electrode, source electrode and, drain electrode are provided on the electron traveling layer.

Japanese Patent Application Publication No. 2003-229439 discloses an example of the normal HEMT structure (hereinafter, referred to as first conventional art). A GaN electron traveling layer (which corresponds to the channel layer in the first conventional art) to which impurities are not added is deposited above a sapphire substrate or SiC substrate via a buffer layer, an n-type AlGaN electron supply layer is deposited above the electron traveling layer via an AlGaN spacer layer, and the gate electrode, is formed on the electron supply layer. The source and drain electrodes are also provided on the electron supply layer via an n-type GaN contact layer.

Meanwhile, according to the first conventional art, the electric polarization is employed as a method for increasing the electron density of 2DEG, in addition to increasing the discontinuous energy of the band gap between the electron supply layer and the electron traveling layer. That is to say, if the positive charge is generated in the interface between the electron supply layer and the electron traveling layer due to the sum of self polarization and piezoelectric polarization, electrons will be induced to cancel the positive charge and the electron density of 2DEG will be increased. The first conventional art also describes that the composition ratio of AlN in the spacer layer is partially increased. Then, the positive charge resulting from the self-polarization and piezoelectric polarization is induced in the proximity of 2DEG to increase the electron density of 2DEG.

Japanese Patent Application Publication No. 2001-77353 discloses an example of the inverted HEMT structure in FIG. 1 (hereinafter, referred to as second conventional art). An AlGaN underlying layer is deposited on the (0001) plane of a sapphire substrate, and an n-type AlGaN electron supply layer having a composition ratio of AlN smaller than that of the underlying layer is deposited on the underlying layer. The electron traveling layer (which corresponds to an electron accumulation layer in the first conventional art) is deposited on the electron supply layer. The gate electrode, source electrode, and drain electrode are formed on the electron traveling layer. The 2DEG is provided in the proximity of the interface between the electron traveling layer and the electron supply layer. In the inverted HEMT structure, there is no AlGaN layer having a large band gap between the source and drain electrodes and 2DEG. The contact resistance of ohmic electrode can be decreased.

However, the normal HEMT structure as disclosed in the first conventional art essentially has the AlGaN electron supply layer having a large band gap between the source and drain electrodes and 2DEG. This causes a drawback of increasing the contact resistance of ohmic electrode.

The second conventional art has a drawback that the electron density of 2DEG is small. This may be caused as follows.

The electric polarization of a semiconductor layer includes self-polarization and piezoelectric polarization. The self-polarization is caused by a difference in electronegativity and is dependent on the type and orientation of crystal. The piezoelectric polarization is caused by distortion of crystal, when a thin film having a different lattice constant is deposited on a semiconductor layer. The charge induced in the interface between two semiconductor layers is the difference of the self-polarization and piezoelectric polarization in the two semiconductor layers. The density of 2DEG in the semiconductor layer equals to the sum of the self-polarization and piezoelectric polarization. For this reason, directions in which both self-polarization and piezoelectric polarization operate influence the density of 2DEG.

FIG. 1 schematically shows semiconductor layers below the gate electrode in the second conventional art. Here, the transverse direction of each layer schematically shows the magnitude of the lattice constant. The upward direction denotes the [0001] crystalline orientation of the wurtzite structure. An AlGaN underlying layer 22, an AlGaN electron supply layer 24, and a GaN electron traveling layer 26 are deposited on the (0001) plane of a sapphire substrate 20 in this order. The GaN crystal and AlGaN crystal are self-polarized so that the [000-1] orientation is positive. The direction of the self-polarization is determined by the direction of Ga—N bonding along the C-axis. Accordingly, in the [0001] crystalline orientation (Ga plane growth), self-polarizations $P_{SP22}$, $P_{SP24}$, $P_{SP26}$ of the underlying layer 22, the electron supply layer 24, and the electron traveling layer 26 work in a downward direction (which is positive). Also, the AlN crystal has a larger self-polarization than that of the GaN crystal. The absolute value of the self-polarization is greater, as the composition ratio of AlN is greater. That is to say, the relationship shown below is satisfied.

$$|P_{SP22}|>|P_{SP24}|>|P_{SP26}|$$

The underlying layer 22 is provided so as to have a thickness enough for lattice relaxation, and the piezoelectric polarization hardly occurs in the underlying layer 22 in the vicinity of the electron supply layer 24. However, the piezoelectric polarization occurs in the electron supply layer 24 and the electron traveling layer 26 due to the difference in the lattice constant between these layers and the underlying layer 22. The electron supply layer 24 and the electron traveling layer 26 have larger lattice constants than that of the underlying layer 22. This results in the upward piezoelectric polarizations $P_{PE24}$ and $P_{PE26}$ in the electron supply layer 24 and the electron traveling layer 26. Also, the electron traveling layer 26 has a lattice constant greater than that of the electron supply layer 24 with respect to the underlying layer 22. That is to say, the relationship shown below is satisfied.

$|P_{PE24}| < |P_{PE26}|$

In the [0001] crystalline orientation (Ga plane growth), if the electron traveling layer 26 is greater in lattice constant than a target (in the aforementioned case, the electron supply layer 24), the piezoelectric polarity works in a positive upward direction. The direction in which the piezoelectric polarization works is determined by (1) the direction of stress applied to the crystal and (2) the crystalline orientation (GaN plane or N plane). In the afore-mentioned case, the magnitude of the lattice constant described above and Ga plane growth cause the piezoelectric charge to work in the upward direction.

The difference between the sum of polarization in the electron supply layer 24 and that of polarization in the electron traveling layer 26 results in the charge generating in the interface between the electron supply layer 24 and the electron traveling layer 26 Accordingly, negative charge develops in the interface between the electron supply layer 24 and the electron traveling layer 26, causing the electron density of 2DEG to decrease. In this case, the polarizations of the electron supply layer 24 and the electron traveling layer 26 cancel each other, which decreases the polarized electrode. As a result, the electron density of 2DEG also decreases.

As described, it is possible to increase the electron density of 2DEG with the use of the self-polarization and piezoelectric polarization in the normal HEMT structure. However, the ohmic contact resistance is high. In contrast, the inverted HEMT structure has a decreased ohmic contact resistance. However, there is a problem that the electron density of 2DEG is low because of the self-polarization and piezoelectric polarization.

According to the first and second conventional arts, the AlGaN film or the GaN film is deposited on the sapphire substrate or the SiC substrate. When the AlGaN film or the GaN film is deposited, Ga is first deposited on the sapphire substrate or the SiC substrate. Therefore, it is not easy to deposit the AlGaN film or the GaN film in the [000-1] crystalline orientation.

SUMMARY OF THE INVENTION

The present invention has been made in view of the above circumstances and provides a semiconductor device including: an AlGaN electron supply layer having a [000-1] crystalline orientation in a thickness direction to a substrate plane; a GaN electron traveling layer formed on the AlGaN electron supply layer; a gate electrode formed above the GaN electron traveling layer; and a source electrode and a drain electrode between which the gate electrode is located, the source and drain electrode being formed on the GaN electron traveling layer. It should be noted that the electron supply layer and the electron traveling layers are formed in the [000-1] crystalline orientation. It is thus possible to realize a semiconductor device having reduced contact resistances between the source and drain electrodes and the 2DEG and having an increased an electron density in the 2DEG.

The semiconductor device may further include an AlGaN semiconductor layer between the GaN electron traveling layer and the gate electrode.

The semiconductor device may be configured so that the AlGaN electron supply layer has a film thickness equal to or less than 300 nm. The semiconductor device may be configured so that the AlGaN electron supply layer has a composition ratio of AlN equal to or less than 0.3.

According to another aspect of the present invention, there is provided a method of fabricating a semiconductor device including: forming by MOCVD in order of an AlGaN electron supply layer and a GaN electron traveling layer having a [000-1] crystalline orientation in a thickness direction to a substrate plane; forming a gate electrode above the GaN electron traveling layer; and forming a source electrode and a drain electrode on the GaN electron traveling layer so that the gate electrode is located between the source and drain electrodes. Since the electron supply layer and the electron traveling layers are formed in the [000-1] crystalline orientation, it is thus possible to realize a semiconductor device having reduced contact resistances between the source and drain electrodes and the 2DEG and having an increased electron density in the 2DEG.

The method may further include forming an AlGaN semiconductor layer on the GaN electron traveling layer, wherein the step of forming the gate electrode comprises forming the gate electrode on the AlGaN semiconductor layer.

The method may be configured so that the step of forming the AlGaN electron supply layer forms the AlGaN electron supply layer having a thickness equal to or less than 300 nm. The method may be configured so that the step of forming the AlGaN electron supply layer having a composition ratio of AlN equal to or less than 0.3.

According to yet another object of the present invention, there is provided a substrate for fabricating a semiconductor device including: a grown substrate for growing a semiconductor layer thereon, the growth substrate having a main surface that is a (000-1) plane; and a GaN-based semiconductor layer grown on the growth substrate in a [000-1] crystalline orientation. Since the electron supply layer and the electron traveling layers are formed in the [000-1] crystalline orientation, it is thus possible to realize a substrate used to fabricate a semiconductor device having reduced contact resistances between the source and drain electrodes and the 2DEG and having an increased electron density in the 2DEG.

The substrate may be configured so that the growth substrate is one of SiC, Si and sapphire. The substrate may be configured so that the GaN-based semiconductor layer comprises a layer formed by MOCVD. The substrate may be configured so that the GaN-based semiconductor layer comprises an AlGaN electron supply layer and a GaN electron traveling layer formed in this order by MOCVD.

According to a further aspect of the present invention, there is provided a method of fabricating a substrate for use in growth including: forming a GaN-based semiconductor layer on a growth substrate having a main surface of a (000-1) plane in a [000-1] crystalline orientation by MOCVD. The method may be configured so that the growth substrate is one of SiC, Si and sapphire. The method may further include forming an AlGaN semiconductor layer on the GaN-based semiconductor layer. The method may be configured so that the step of forming the GaN-based semiconductor layer comprises forming an AlGaN electron supply layer and a GaN electron traveling layer in this order.

According to a still further aspect of the present invention, there is provided a having a (000-1) plane that is a main surface serving as a growth surface on which a GaN semiconductor layer is grown in a [000-1] crystalline orientation. The substrate may be configured so that the substrate is one of SiC, Si sapphire and a GaN-based semiconductor. The substrate may be configured so that the GaN semiconductor layer is formed on the substrate by MOCVD. The substrate may be configured so that the GaN-based semiconductor layer comprises an AlGaN electrode supply layer and a GaN electron supply layer formed in this order.

BRIEF DESCRIPTION OF THE DRAWINGS

Preferred embodiments of the present invention will be described in detail with reference to the following drawings, wherein.

DESCRIPTION OF THE PREFERRED EMBODIMENTS

A description will now be given, with reference to the accompanying drawings, of embodiments of the present invention.

First Embodiment

Figure 1:
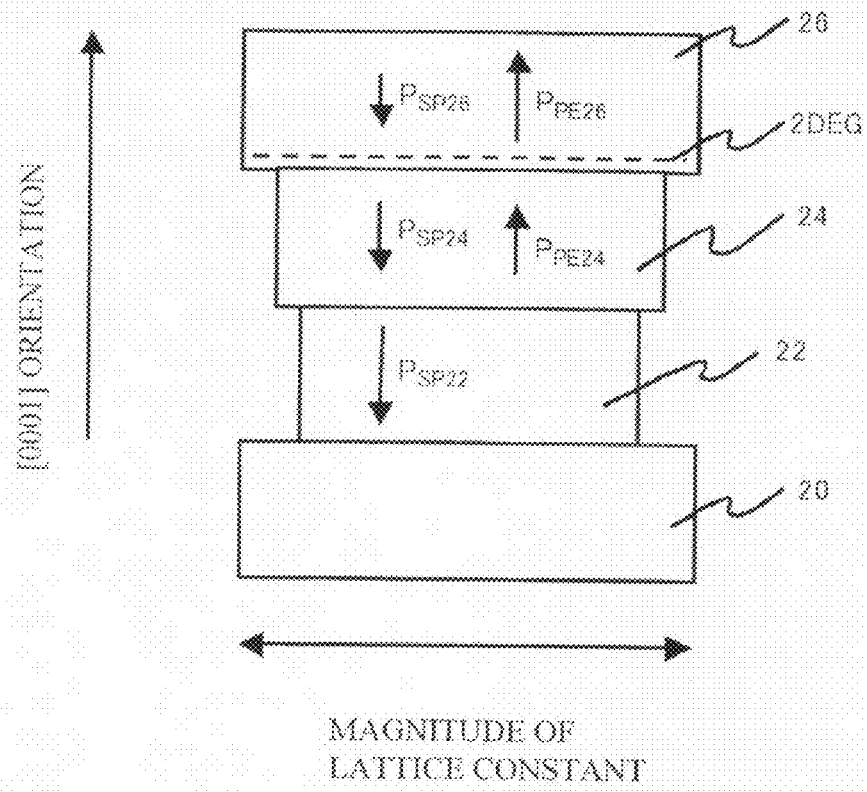
FIG. 1 is a schematic diagram showing a problem of the second conventional art.
Figure 2:
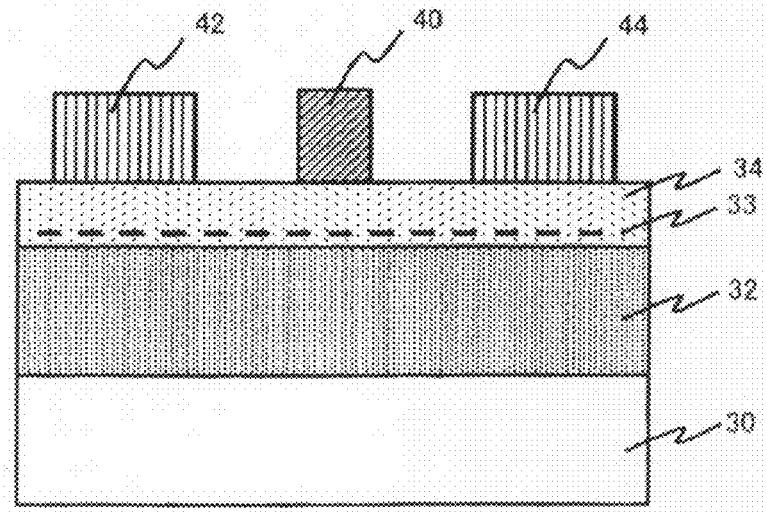
FIG. 2 is a cross-sectional view of a semiconductor device in accordance with a first embodiment of the present invention.

FIG. 2 is a cross-sectional view of a semiconductor device in accordance with a first embodiment of the present invention. An n-type AlGaN electron supply layer 32 is formed by Metal Organic Chemical Vapor deposition (MOCVD) on the (000-1) plane of a GaN substrate 30 (semiconductor growth substrate). The n-type AlGaN electron supply layer 32 has a [000-1] crystalline orientation in a thickness direction to a substrate plane, and Si is doped therein. The electron supply layer 32 has a thickness of 200 nm, a Si donor concentration of $1 \times 10^{16}$ cm$^{-3}$, and a composition ratio of AlN in AlGaN equal to 0.25. The electron supply layer 32 has a thickness that does not cause lattice relaxation in the electron supply layer 32. It is preferable that the electron supply layer 32 should have a thickness equal to or less than 300 nm, and more preferably, equal to or less than 200 nm. For example, in a case where the electron supply layer 32 has a thickness equal to or less than 200 nm, stress applied to the electron supply layer 32 works significantly, enabling to obtain the effect of the piezoelectric polarity strongly.

In addition, it is preferable that the electron supply layer 32 should have a thickness equal to or more than 10 nm, which is enough to obtain the effect of the piezoelectric polarization sufficiently. It is also preferable that the composition ratio of AlN in the AlGaN electron supply layer 32 should be equal to or less than 0.3, and more preferably, equal to or less than 0.25. As the composition ratio of AlN is higher, the piezoelectric polarity becomes greater. This results in a higher density of 2DEG. However, for example, in a case where the composition ratio of AlN in the AlGaN electron supply layer 32 is equal to or more than 0.3, lattice mismatch is present between the electron supply layer 32 and the GaN layer of an electron traveling layer 34, thereby deteriorating the crystalline properties. For example, for a composition ratio of AlN in the AlGaN electron supply layer 32 of 0.25 or less, the lattice mismatch between the electron supply layer 32 and the GaN layer of the electron traveling layer 34 is considerably improved. Also, a GaN substrate is preferable for the semiconductor growth substrate, yet a SiC substrate, Si substrate, or a sapphire substrate can be used.

Next, the GaN electron traveling layer 34 is formed on the electron supply layer 32 by MOCVD. No impurities are added to the GaN electron traveling layer 34. A 2DEG 33 is generated in a portion of the electron traveling layer 34 close to the interface with the electron supply layer 32. The electron traveling layer 34 may have a thickness of 20 nm. It is preferable that the electron traveling layer 34 should have a thickness equal to or less than 50 nm, in which a low ohmic electrode contact resistance and a high threshold voltage are available. For example, when the electron traveling layer 34 becomes equal to or more than 50 nm, the distance between a source electrode 42 and the electron traveling layer 34 and the distance between a drain electrode 44 and the electron traveling layer 34 are longer. This increases the contact resistance value between the source electrode 42 and the 2DEG 33 and the resistance value between the drain electrode 44 and the 2DEG 33. Also, it is preferable that the electron traveling layer 34 should have a thickness equal to or more than 5 nm, which is capable of sufficiently suppressing the leakage current flowing in the gate electrode in the reverse direction.

In the first embodiment, the semiconductor device employs the inverted HEMT structure, making it possible to reduce the ohmic contact resistance. In addition, it is possible to increase the electron density of 2DEG. A description will be given of the principle of such an increased electron density of 2DEG.

Figure 3:
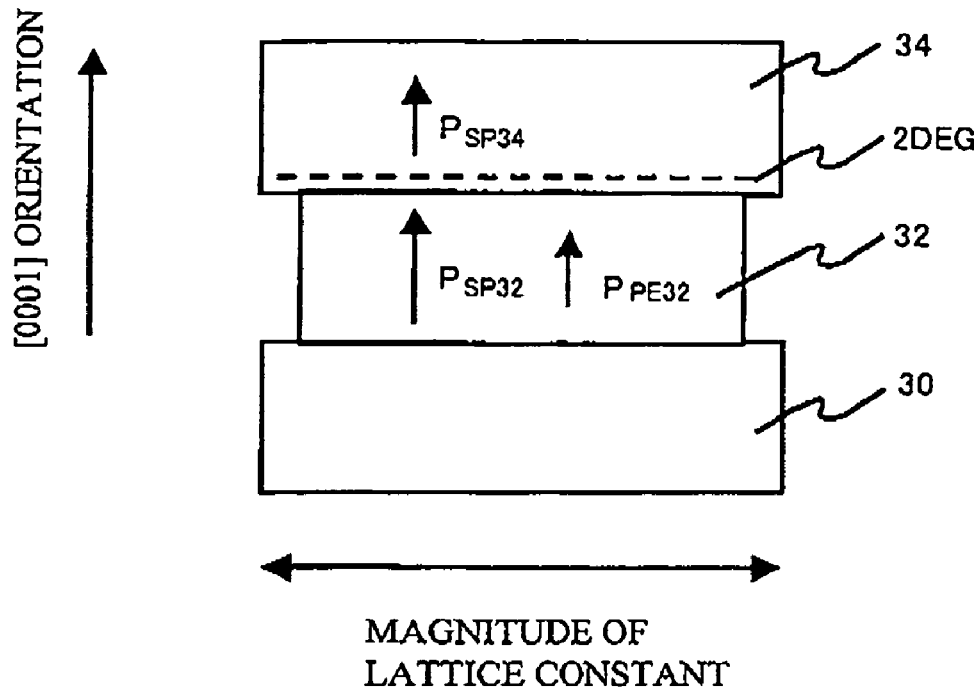
FIG. 3 is a schematic diagram showing advantages of the first embodiment.

FIG. 3 schematically shows semiconductor layers provided below the gate electrode in accordance with the first embodiment of the present invention. The transverse direction of each layer schematically shows the magnitude of the lattice constant. The upward direction denotes the [000-1] crystalline direction of the wurtzite structure. The electron supply layer 32 and the electron traveling layer 34 are deposited on the (000-1) plane of the GaN substrate. The self-polarization $P_{SP}32$ and $P_{SP}34$ of the electron supply layer 32 and the electron traveling layer 34 occurs in the upward direction (which is positive). The self-polarization works in the upward direction in the [000-1] crystalline orientation (N plane growth), because of the direction of Ga—N bounding along C-axis. The expression below is satisfied.

$$|P_{SP32}| > |P_{SP34}|$$

Meanwhile, the electron supply layer 32 has a lattice constant smaller than that of the GaN substrate 30. The [000-1] crystalline direction, namely, the upward direction is positive, and piezoelectric polarization of $P_{PE32}$ occurs. The electron supply layer 32 is not deposited thick enough to the lattice relaxation. As a result, the stress is applied to the electron supply layer 32. With respect to the [000-1] crystalline orientation (N plane growth), in a case where the electron supply layer 32 has a smaller lattice constant than that of a target (substrate, in the afore-mentioned case), the piezoelectric polarity works in the upward direction. For example, the GaN crystal has a lattice constant of 0.3189 nm, and the AlGaN crystal having a composition ratio of AlN equal to 0.25 has a lattice constant of 0.3170 nm. The electron traveling layer 34 has a lattice constant equal to that of the GaN substrate 30, and the piezoelectric polarization does not occur.

As described heretofore, the self-polarization and piezoelectric polarization generate the positive charge in the interface between the electron supply layer 32 and the electron traveling layer 34. This enables the electron density of 2DEG to be increased. According to the second conventional art, the electron density of 2DEG is $8.1 \times 10^{12}$ cm$^{-2}$. In contrast, the first embodiment of the present invention has a 2DEG electron density of $1 \times 10^{13}$ cm$^{-3}$.

Figure 4:
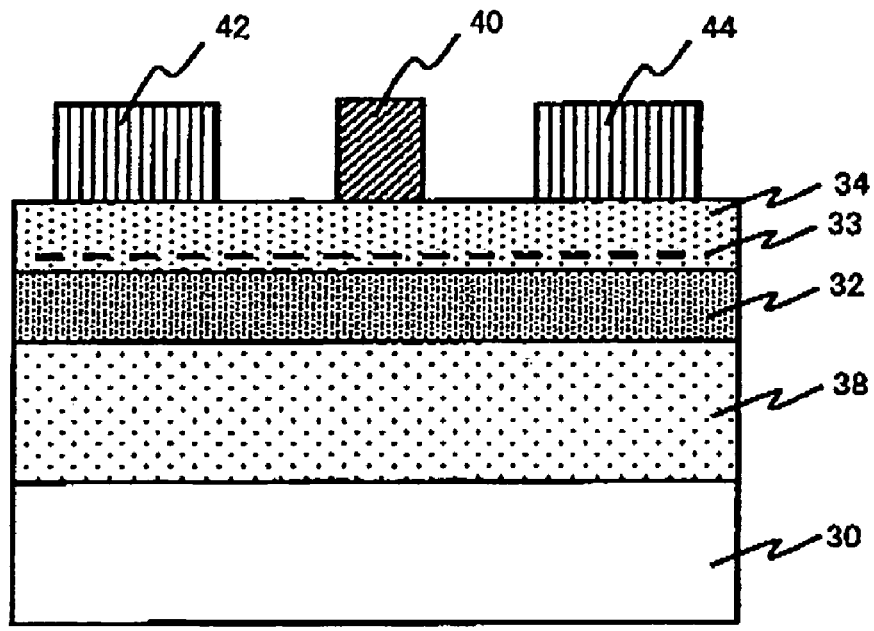
FIG. 4 is a cross-sectional view of a variation of the first embodiment.

FIG. 4 is a variation example in accordance with the first embodiment of the present invention. Prior to deposition of the electron supply layer 32 on the GaN substrate 30, a GaN buffer layer 38 is deposited on the (000-1) plane of the GaN substrate 30 by MOCVD. This improves the crystalline properties of the layers provided on and above the GaN buffer layer 38. Both GaN substrate 30 and the GaN buffer layer 38 include GaN, thereby the same effect as described in the first embodiment is obtainable in the present variation example.

Second Embodiment

Figure 5:
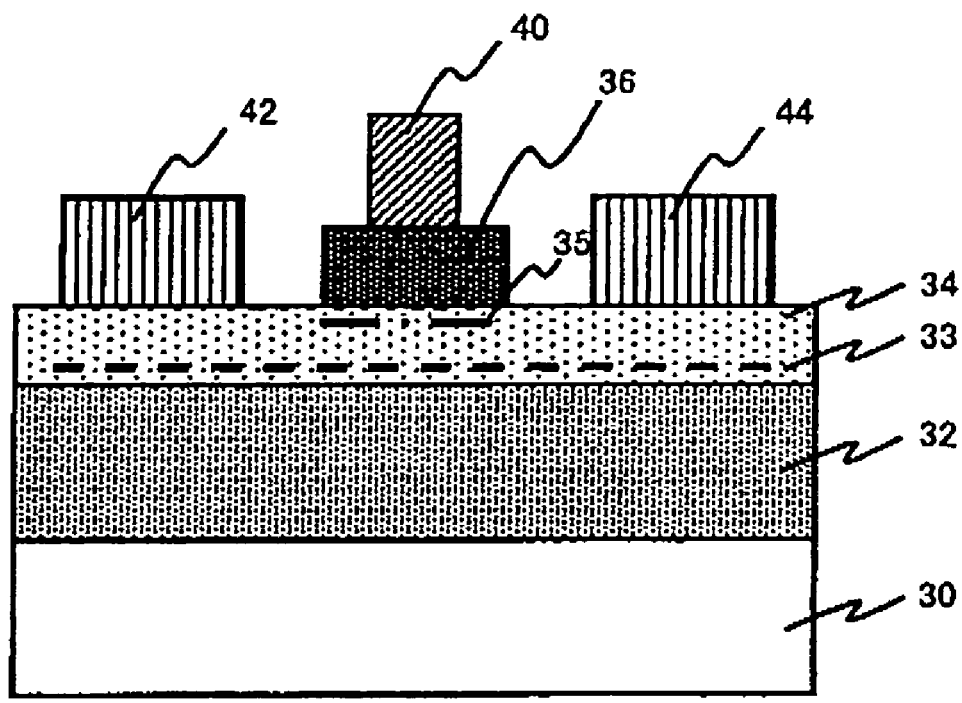
FIG. 5 is a cross-sectional view of a semiconductor device in accordance with a second embodiment of the present invention.

FIG. 5 shows a cross-sectional view of a semiconductor device in accordance with a second embodiment of the present invention. The second embodiment is a semiconductor device having the inverted HEMT structure that enables a higher-performance in which an AlGaN barrier layer 36 (AlGaN semiconductor layer) is provided. Hereinafter, a fabrication method will be described.

Figure 6:
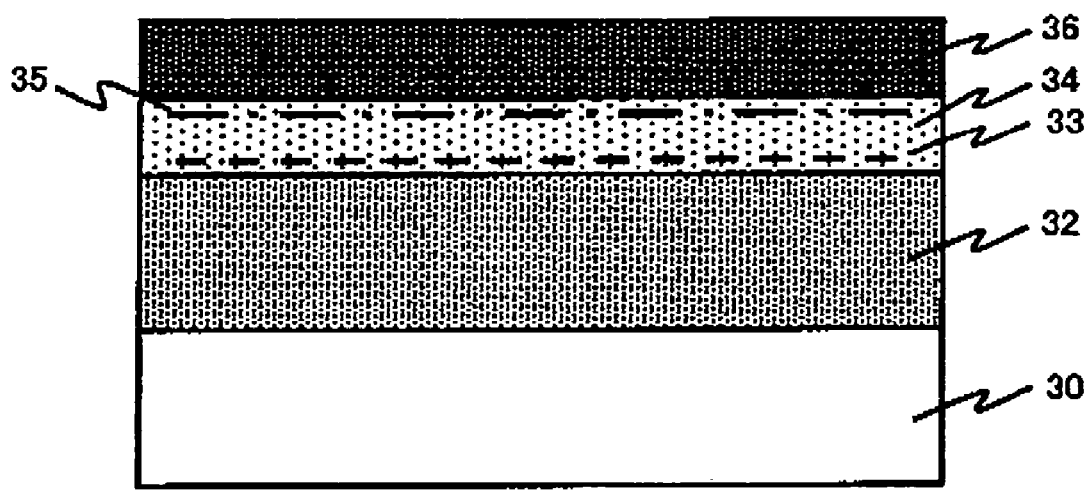
FIG. 6 is a cross-sectional view showing a fabrication process in accordance with the second embodiment.

Referring now to FIG. 6, an n-type AlGaN electron supply layer with silicon being doped is first formed by MOCVD on the (000-1) plane of the GaN substrate in the [000-1] crystalline orientation. The electron supply layer 32 has a thickness of 300 nm, a donor concentration of $1 \times 10^{16}$ cm$^{-3}$, and a composition ratio of AlN equal to 0.25. Next, the GaN electron traveling layer 34 is deposited on the electron supply layer 32 by MOCVD. The electron traveling layer 34 is 10 nm thick. The electron traveling layer 34 is as thin as 10 nm or less, because the E-mode threshold voltage is desired. For example, in a case where the electron traveling layer 34 is as thick as 10 nm or more, a p-type barrier layer 36 and the 2DEG 33 has a longer distance. Thus, the depletion layer shrinks and the threshold value is shifted to a negative direction. As a result, if the threshold value is lower than 0 V, the E-mode is changed to D-mode. Then, the p-type AlGaN barrier layer 36 (AlGaN semiconductor layer) is deposited on the electron traveling layer 34 by MOCVD. The barrier layer 36 has a thickness of 200 nm, an acceptor concentration of $2 \times 10^{18}$ cm$^{-3}$, and a composition ratio of AlN equal to 0.3. At this time, the 2DEG 33 is generated in the vicinity of the interface with the electron supply layer 32 in the electron traveling layer 34. A 2DHG 35 is produced in the vicinity of the interface with the barrier layer 36 in the electron traveling layer 34. In this manner, the substrate for fabricating a semiconductor device is produced.

Figure 7:
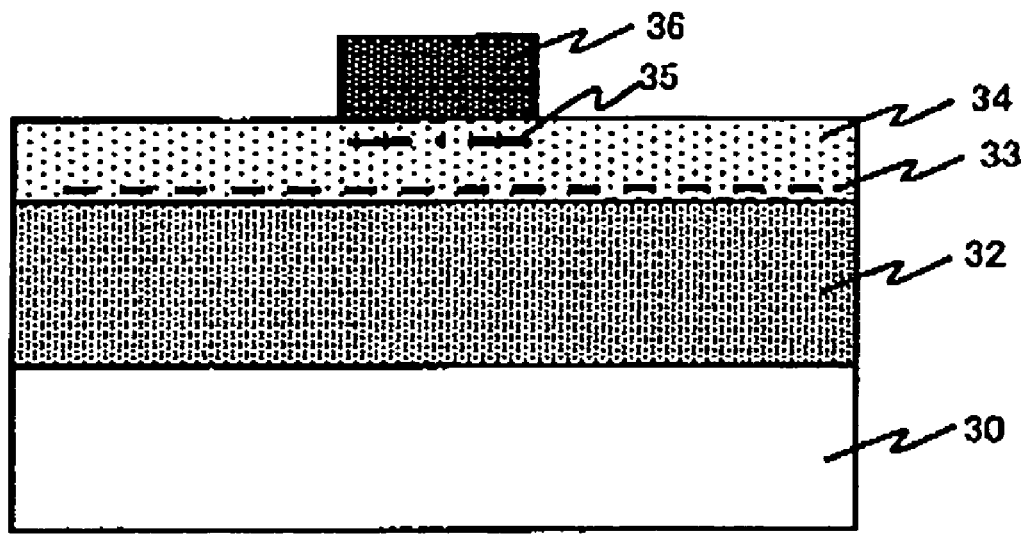
FIG. 7 is a cross-sectional view showing a fabrication process that follows the process shown in FIG. 6.

Referring now to FIG. 7, regions for forming the source electrode and the drain electrode in the barrier layer 36 are removed by dry etching or wet etching. Alternatively, the barrier layer 36 can be selectively grown only on a region for forming a gate electrode 40, for example, by using a silicon oxide film used as a mask.

Figure 8:
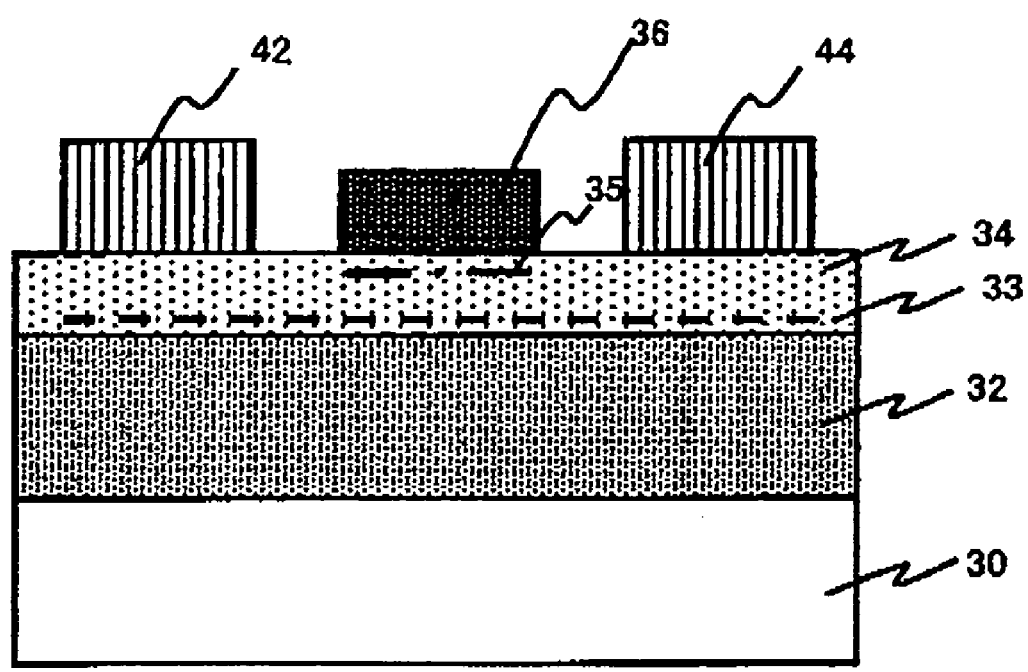
FIG. 8 is a cross-sectional view showing a fabrication process that follows the process shown in FIG. 7.

Subsequently, referring to FIG. 8, Ti/Al is formed as a source electrode and a drain electrode on the electron traveling layer 34 by a deposition method and liftoff technique. Lastly, Ni/Au is formed as the gate electrode 40 on the barrier layer 36. Thus, the semiconductor device having the inverted HEMT structure is produced. The structure of FIG. 8 is inverted from that shown in FIG. 5.

Figure 9:
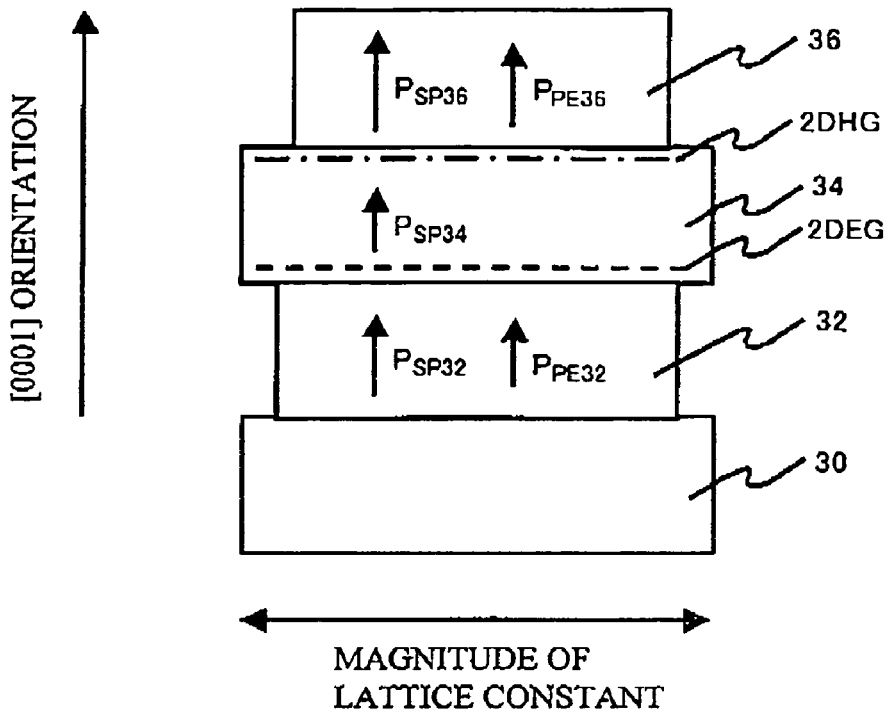
FIG. 9 is a schematic diagram showing advantages of the second embodiment.

FIG. 9 schematically shows the semiconductor layers below the gate electrode in accordance with the second embodiment of the present invention. Here, the transverse direction of each layer schematically shows the magnitude of the lattice constant. The upward direction denotes the [000-1] crystalline orientation of the wurtzite structure. The electron supply layer 32, the electron traveling layer 34, and the barrier layer 36 are deposited on the (000-1) plane of the CaN substrate in [000-1] crystalline orientation. The directions of self-polarization $P_{SP32}$, $P_{SP34}$, and $P_{SP36}$ of the electron supply layer 32, the electron traveling layer 34, and the barrier layer 36 correspond to the [000-1] crystalline orientation. That is, the upward direction is positive. The expression below is satisfied.

$$|P_{SP36}|-|P_{SP32}|>|P_{SP34}|$$

Meanwhile, the electron supply layer 32 and the barrier layer 36 have smaller lattice constants than that of the GaN substrate 30. Piezoelectric polarizations $P_{PE32}$ and $P_{PE36}$ of the electron supply layer 32 and the barrier layer 36 are positive in the upward direction. The electron traveling layer 34 has a lattice constant equal to that of the GaN substrate 30. Therefore, the piezoelectric polarization is not produced.

As described, positive charge is induced by the self-polarization and piezoelectric polarization in the interface between the electron supply layer 32 and the electron traveling layer 34. This enables to increase the electron density of 2DEG 33 as described in the first embodiment. Also, negative charge is induced by the self-polarization and piezoelectric polarization in the interface between the electron traveling layer 34 and the barrier layer 36. This enables to increase the hole density of the 2DHG 35 produced in the vicinity of the interface with the barrier layer 36 in the electron traveling layer 34.

In the first embodiment, however, it is not easy to obtain the E-mode having an excellent performance The thickness of the electron traveling layer 24 has to be reduced to make the threshold voltage positive. However, if the thickness of the electron traveling layer 34 is reduced, leakage current flowing through the gate electrode will be increased. In addition, a pinch-off characteristic will be deteriorated. Accordingly, in the second embodiment, the barrier layer 36, which has a wide band gap and serves as a barrier for electrons and holes, is provided on the electron traveling layer 34. The barrier layer 36 is capable of suppressing the leakage current of the gate electrode, even if the thickness of the electron traveling layer 34 is reduced. Furthermore, the barrier layer 36 and the 2DHG 35 enlarge the depletion layer created immediately below the gate electrode, making it possible to realize an E-mode HEMT having an excellent pinch-off characteristic.

Figure 10:
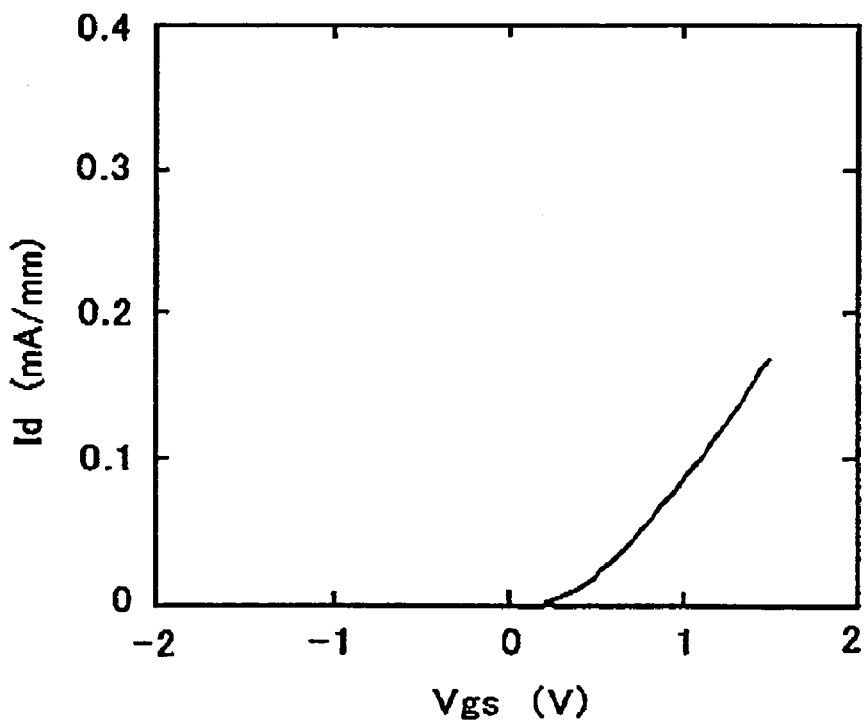
FIG. 10 is a graph of an electrical characteristic of the second embodiment.

FIG. 10 shows characteristics of drain current(Ids) vs gate-source voltage (Vgs) of the semiconductor device in accordance with the second embodiment of the present invention. In the second embodiment, the electron supply layer 32 is an AlGaN layer having a composition ratio of AlN equal to 0.25, the electron traveling layer 34 of a 20 nm thick GaN layer to which impurities are implanted, and the barrier layer of an 30 nm thick AlGaN layer that has an acceptor concentration of $2\times10^{18}$ cm$^{-3}$ and has a composition ratio of 0.25. In the HEMT of the second embodiment, the drain current Id does not flow when the gate-source voltage Vgs falls in the negative region, and a good pinch-off characteristic is obtained. This is because the depletion layer immediately below the gate electrode is extended by the barrier layer 36 and the 2DHG 35. It is thus possible to realize the HEMT having the good E-mode.

As described above, the first and second embodiments are capable of forming the electron supply layer and the electron traveling layer in the [000-1] crystalline orientation. It is thus possible to provide a semiconductor device having reduced contact resistances between the source and drain electrodes and the 2DEG and having an increased electron density in the 2DEG and to provide a fabrication method thereof. It is also possible to provide a growth substrate used to fabricate the semiconductor device mentioned above and a fabrication method thereof. The same advantages as mentioned above can be obtained by a substrate having a (000-1) plane that is a main surface serving as a growth surface on which a GaN semiconductor layer is grown in a [000-1] crystalline orientation.

The present invention is not limited to the above-mentioned embodiments, and other embodiments, variations and modifications may be made without departing from the scope of the present invention. For example, an AlGaN stopper layer may be interposed between the electron supply layer 32 and the electron traveling layer. The impurity concentration of the electron supply layer may be changed.

The present invention is based on Japanese Patent Application No. 2005-082308 filed on Mar. 22, 2005, the entire disclosure of which is hereby incorporated by reference.

What is claimed is:

1. A semiconductor device comprising:

an AlGaN electron supply layer grown on a (000-1) surface of a substrate in a [000-1] crystalline orientation;

a GaN electron traveling layer formed on the AlGaN electron supply layer;

a gate electrode formed above the GaN electron traveling layer; and a source electrode and a drain electrode between which the gate electrode is located, the source and drain electrode being formed on the GaN electron traveling layer.

2. The semiconductor device as claimed in claim 1, further comprising an AlGaN semiconductor layer between the GaN electron traveling layer and the gate electrode.

3. The semiconductor device as claimed in claim 1, wherein the AlGaN electron supply layer has a film thickness equal to or less than 300 nm.

4. The semiconductor device as claimed in claim 1, wherein the AlGaN electron supply layer has a composition ratio of AlN equal to or less than 0.3.

* * * * *